United States Patent [19]

Kawata et al.

[11] Patent Number: 4,791,320

[45] Date of Patent: Dec. 13, 1988

[54] BIPOLAR-MISFET COMPOUND INVERTER WITH DISCHARGE TRANSISTOR

[75] Inventors: Mitsuya Kawata, Yokohama; Tetsu Tanizawa, Kawasaki, both of Japan

[73] Assignee: Fujitsu Limited, Kanagawa, Japan

[21] Appl. No.: 897,460

[22] Filed: Aug. 18, 1986

[30] Foreign Application Priority Data

Aug. 20, 1985 [JP] Japan .................... 60-181065

[51] Int. Cl.$^4$ ............................ H03K 19/01
[52] U.S. Cl. ................... 307/446; 307/300; 307/443; 307/451; 307/454
[58] Field of Search ........ 307/200 B, 443, 446, 307/448, 451, 454, 570, 255, 270, 300; 357/43

[56] References Cited

U.S. PATENT DOCUMENTS

| | | | |
|---|---|---|---|
| 3,541,353 | 11/1970 | Seelbach et al. | 307/446 |
| 3,649,843 | 3/1972 | Redwine et al. | 307/446 |
| 4,103,188 | 7/1978 | Morton | 307/300 X |
| 4,280,065 | 7/1981 | Minato et al. | 307/448 X |
| 4,301,383 | 11/1981 | Taylor | 307/303 X |
| 4,558,234 | 12/1985 | Suzuki et al. | 307/475 X |
| 4,602,269 | 7/1986 | Koike | 307/446 X |
| 4,604,535 | 8/1986 | Sasayama et al. | 307/570 |
| 4,616,146 | 10/1986 | Lee et al. | 307/446 |
| 4,638,186 | 1/1987 | McLaughlin | 307/446 |
| 4,682,054 | 7/1987 | McLaughlin | 307/446 |

FOREIGN PATENT DOCUMENTS

| | | | |
|---|---|---|---|
| 0099100 | 1/1984 | European Pat. Off. | 307/446 |
| 53-87187 | 8/1978 | Japan . | |
| 54-148469 | 11/1979 | Japan . | |
| 0079641 | 5/1984 | Japan | 307/446 |

OTHER PUBLICATIONS

Lin et al, "Complementary MOS–Bipolar Transistor Structure", IEEE TELD, vol. Ed-16, No. 11, Nov. 1969, pp. 945–951.

Primary Examiner—Stanley D. Miller
Assistant Examiner—D. R. Hudspeth
Attorney, Agent, or Firm—Armstrong, Nikaido, Marmelstein & Kubovcik

[57] ABSTRACT

A compound transistor type inverter, i.e., comprised of MIS and bipolar transistors, including, at the output stage thereof, an npn transistor operative to charge a load. The npn transistor can be quickly cut OFF by an additional transistor, and simultaneously, the additional transistor is operative to attain a quick discharge from the load. Still another additional transistor is employed, in a case where the inverter includes a pnp transistor, other than the npn transistor, at a ground side, which another additional transistor is operative to bypass the collector and emitter of the pnp transistor.

9 Claims, 9 Drawing Sheets

BIPOLAR-MISFET COMPOUND INVERTER WITH DISCHARGE TRANSISTOR

BACKGROUND OF THE INVENTION

1. Field of the Invention

The present invention relates to a compound transistor type inverter.

The compound transistor type inverter is a so-called BiMOS transistor type inverter which is a combination of at least one bipolar transistor and at least one metal insulator semiconductor (MIS) transistor, as will be explained hereinafter with reference to the related figures. The inverter comprised of the thus-combined transistors produces advantages inherent to both the bipolar and MIS transistors, simultaneously, and thus has recently been used in practical application.

2. Description of the Related Art

The prior art compound transistor type inverter has an improved output characteristic in comparison with a conventional MIS transistor type inverter. That is, the output from the compound transistor type inverter has a quicker rise and fall than that of the MIS type inverter.

Recently, however, it has been found that the improvement in the output by the prior art of the compound transistor type inverter is now insufficient to cope with a high speed logic device, and further, the prior art inverter of the same type has a poor output stability, especially, when desiring to obtain a sufficiently low "L" level where the related output terminal is provided with a current source, as will be mentioned in detail hereinafter.

SUMMARY OF THE INVENTION

It is an object of the present invention to provide a compound transistor type inverter having an improved output characteristic, particularly in the fall of an output from "H" to "L" and the "L" level output.

The above object of the present invention is attained, in a first type inverter, by introducing therein an additional n-channel MIS transistor for drawing a current from an output terminal thereof to a ground, and in a second type inverter, another additional n-channel MIS transistor, other than an additional n-channel MIS transistor functionally identical to the above-mentioned additional n-channel MIS transistor of the first type inverter.

BRIEF DESCRIPTION OF THE DRAWINGS

The present invention will be more apparent from the ensuring description with reference to the accompanying drawings, wherein.

DESCRIPTION OF THE PREFERRED EMBODIMENTS

Before describing the embodiments of the present invention, the prior art and the problems therein will be first described with reference to the related figures.

Figure 1:
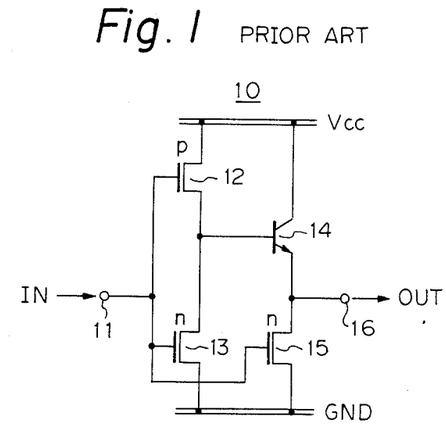
FIG. 1 is a circuit diagram of a first example of a prior art compound transistor type inverter.

FIG. 1 is a circuit diagram of a first example of a prior art compound transistor type inverter. In FIG. 1, a compound transistor type inverter 10 receives an input IN at an input terminal 11 and an inverted output OUT is produced from an output terminal 16. At the input side of the inverter 10, an input stage comprising a pair of MIS transistors is formed, which is comprised of both a p-channel MIS transistor 12 and an n-channel MIS transistor 13, connected together in series between a power source Vcc and a ground GND. At the output side of the inverter, an output stage comprising a pair of transistors is formed, which is comprised of both an npn transistor 14 and an n-channel MIS transistor 15, connected together in series between the power source Vcc and the ground GND. The output stage transistor pair having the output terminal 16 is controlled by the input stage transistor pair having the input terminal 11.

When the "H" level input IN is given, the n-channel MIS transistor 13 is made ON and the p-channel MIS transistor 12 is made OFF, while the n-channel MIS transistor 15 is made ON and the npn transistor 14 is made OFF. Accordingly, a passage between the power source Vcc and the output terminal 16 is cut OFF, and at the same time, a current is drawn from the output terminal 16 to the ground GND via the n-channel MIS transistor 15. As a result, the output terminal 16 produces the "L" level output OUT, which is an inversion of the input IN now at the "H" level.

When the "L" level input IN is given, the p-channel MIS transistor 12 is made ON and the n-channel MIS transistor 13 is made OFF, while the npn transistor 14 is made ON and the n-channel MIS transistor 15 is made OFF. Accordingly, a passage between the ground GND and the output terminal 16 is cut OFF, and at the same time, the output terminal is charged by the power source Vcc via the npn transistor 14. As a result, the level of the output terminal 16 increases to approximately the Vcc level, and thereby, the "H" level output OUT is obtained which is an inversion of the input IN now at the "L" level. The first example of FIG. 1 is disclosed in FIG. 3 of Japanese Unexamined Patent Publication No. 53-87187, published on Aug. 1, 1978.

Figure 2:
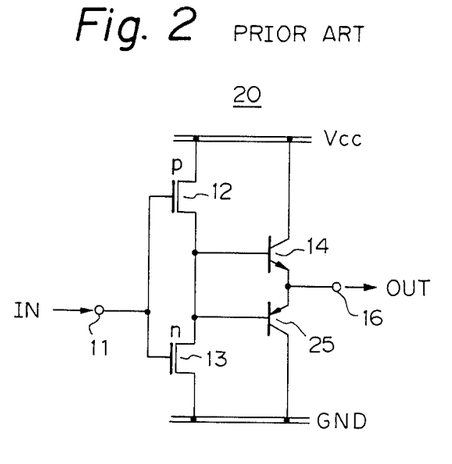
FIG. 2 is a circuit diagram of a second example of a prior art compound transistor type inverter.

FIG. 2 is a circuit diagram of a second example of a prior art compound transistor type inverter. In FIG. 2 and later figures, members identical to those of previous figures are represented by the same reference numerals or characters. In FIG. 2, a compound transistor type inverter 20 is constructed such that a pnp transistor 25 is employed as a ground side transistor in an output stage transistor pair, instead of the n-channel MIS transistor 15 used in the output stage transistor pair of FIG. 1. However, the operation of the inverter 20 is the same as the above-explained operation of the inverter 10. The second example of FIG. 2 is disclosed in FIG. 3 of Japanese Unexamined Patent Publication No. 54-148469, published on Nov. 20, 1979.

The above-mentioned compound transistor type inverters 10 and 20 are basically fabricated with MIS transistors which are, as known, beneficial to simplifying a production process, and with the bipolar transistor or transistors, at a desired portion only thereof, which bipolar transistor has, as known, a very high driving power and very low resistivity when it is ON. Whereby an inverter having a high degree of efficiency can be realized.

Figure 3A:
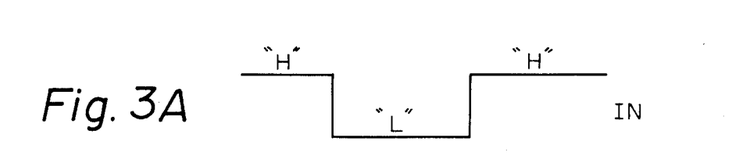
FIGS. 3A and 3B depict waveforms of an input IN and an output OUT, respectively.
Figure 3B:
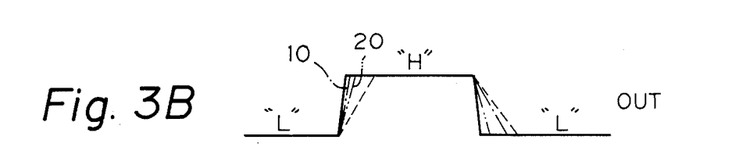

Further, the compound transistor type inverter can have an improved output characteristic in comparison with the conventional MIS transistor type inverter. This will be clarified with reference to FIG. 3.

FIGS. 3A and 3B depict waveforms of the input IN and the output OUT, respectively. It should be understood that the wave form of the input IN, shown in FIG. 3A, is illustrated in an ideal form and FIG. 3A represents a case where the input IN is changed, for example "H"→"L"→"H". The waveform of the output OUT, indicated by broken lines in FIG. 3B, represents the output obtained with the use of the conventional MIS transistor type inverter. The output therefrom exhibits, although exaggerated in FIG. 3B, a very slow rise and very slow fall at the leading edge and trailing edge, respectively. In these circumstance, when the compound transistor type inverter 10 of FIG. 1 is used, the leading edge of the output changes quickly from "L" to "H", as indicated by the single dotted chain line 10 in FIG. 3B, due to the presence of the npn transistor 14. This is also true for the compound transistor type inverter 20 of FIG. 2, and thus the leading edge of the output changes quickly from "L" to "H", as indicated by the double dotted chain line 20. In actuality, the lines 10 and 20 at the leading edge side virtually overlap each other, but these lines are illustrated separately for distinguishing therebetween.

On the other hand, in the inverter 20 of FIG. 2, the trailing edge of the output also changes quickly from "H" to "L" due to the presence of the pnp transistor 25. Note, the change of the trailing edge in the case of the inverter 10 (FIG. 1) is substantially identical to the change of the same in the case of the conventional MIS transistor type inverter.

Lately, there has arisen a tendency to realize higher speed logic devices. In this regard, even through a change of the leading edge of the output may be left as it is, the level of the trailing edge thereof must be sharply changed, as indicated by a solid line in FIG. 3B. From this viewpoint, the compound transistor type inverters 10 and 20 are unsatisfactory in that they cannot obtain such a sharp fall at the trailing edge of the output.

Further, regarding the inverter 20, the "L" level of the output thereof is shifted by above 0.8 V relative to the ground level, due to the base-emitter voltage $V_{BE}$ of the pnp transistor 25 when it is ON.

Furthermore, regarding both inverters 10 and 20, when each of these inverters is provided with a current source at its output terminal, the inverter has a poor stability, since a really low "L" output level is not obtainable. The above-mentioned current source is specifically a capacitive load. In a high speed logic device, a charge and discharge of the capacitive load must be carried out quickly. If the discharge is not completed rapidly and some charges remain at the capacitive load due to high speed switching of the charge and discharge, the voltage at the capacitive load will slightly deviate from the ground level. Thereby, the really low "L" level is not obtainable.

According to the present invention, an additional transistor means is further incorporated into each of the compound transistor type inverters 10 and 20. The additional transistor means is operative to shunt between the base and emitter of the npn transistor 14 so as to attain a quick cut off of the pnp transistor and, at the same time, a quick discharge of current to be drawn from the output terminal 16 to the ground GND via the n-channel MIS transistor 13.

In the inverter 20, still another additional transistor means is incorporated therein, other than the above-mentioned additional transistor means, so as to bypass the emitter and collector of the pnp transistor 25. Each additional transistor means is made ON and OFF in accordance with the level of the input IN.

A summary of the operation achieved in each of the compound transistor type inverters according to the present invention, will be give below. As mentioned before, the base and emitter of the npn transistor is shunted by the additional transistor means. This means that the base and emitter of the npn transistor 14 is short-circuited so that the npn transistor 14 is quickly turned OFF. Therefore, the leakage current from the source Vcc to the output terminal 16 cannot continue flowing for a long time during the change of the output from "H" to "L", and thus a quick fall at the trailing edge of the output can be obtained.

Also, at the trailing edge of the output, the discharge current is strongly drawn from the output terminal 16. This also contributes to realizing the aforesaid quick fall of the output, as well as the stabilization of the "L" level output OUT, since the aforesaid capacitive load is completely discharged.

The aforesaid another additional transistor means to be incorporated in the compound transistor type inverter 20 is operative not only to increase a capability for drawing the discharge current from the output terminal 16, but also to bypass the emitter and collector so as to short-circuit the output terminal 16 to the ground GND, so that a stable and really low "L" level output can be obtained.

Figure 4:
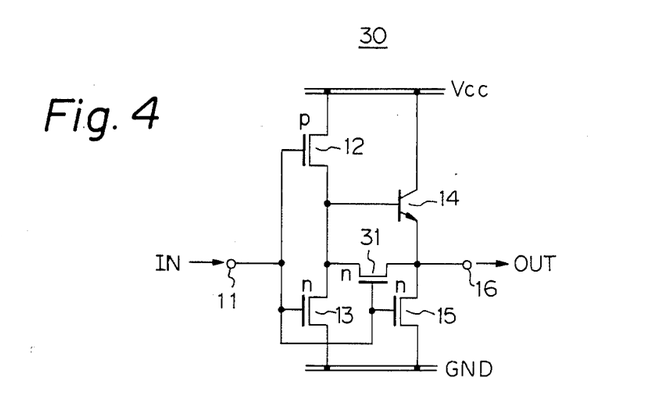
FIG. 4 is a circuit diagram of a compound transistor type inverter according to a first embodiment of the present invention.

FIG. 4 is a circuit diagram of a compound transistor type inverter according to a first embodiment of the present invention. In a compound transistor type inverter 30, based on the inverter 10 (FIG. 1), the previously mentioned additional transistor means is preferably comprised of an n-channel MIS transistor 31, and incorporated therein as shown in FIG. 4. The thus-incorporated transistor 31 is turned ON when the input IN changes from "L" to "H", so that the base and emitter of the npn transistor 14 is thereby shunted. At the same time, the capability for drawing the discharge current from the output terminal 16 is further increased over that of the prior art inverter. As a result, the output OUT falls quickly from "H" to "L".

Figure 5:
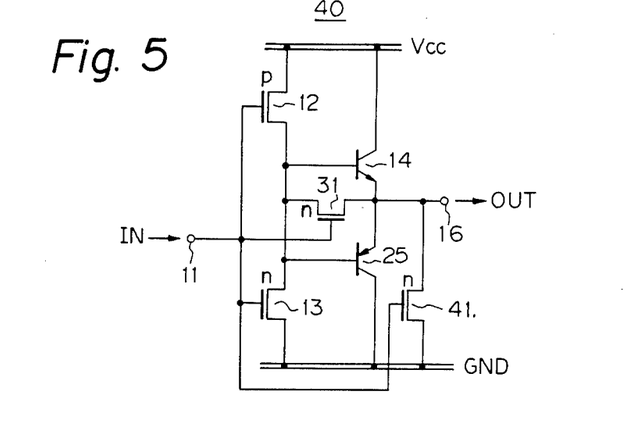
FIG. 5 is a circuit diagram of a compound transistor type inverter according to a second embodiment of the present invention.

FIG. 5 is a circuit diagram of a compound transistor type inverter according to a second embodiment of the present invention. In a compound transistor type inverter 40, based on the inverter 20 (FIG. 2), the previously mentioned additional transistor means and another additional transistor means are preferably comprised of a first n-channel MIS transistor 31 and a second n-channel MIS transistor 41, respectively, and incorporated therein as shown in FIG. 5. The advantage produced by the first n-channel MIS transistor 31 has already been mentioned in reference to the inverter 30 of FIG. 4. The advantages produced by the second n-channel MIS transistor 41 are that, first the output OUT is held, in response to the change of the input IN from "L" to "H", at a really low "L" level, and second, a discharge from the output terminal 16 can be thereby accelerated. As mentioned above, the change from "H" to "L" of the output characteristic can be improved in each of the inverters 30 and 40 when compared with the prior art inverter.

Figure 6:
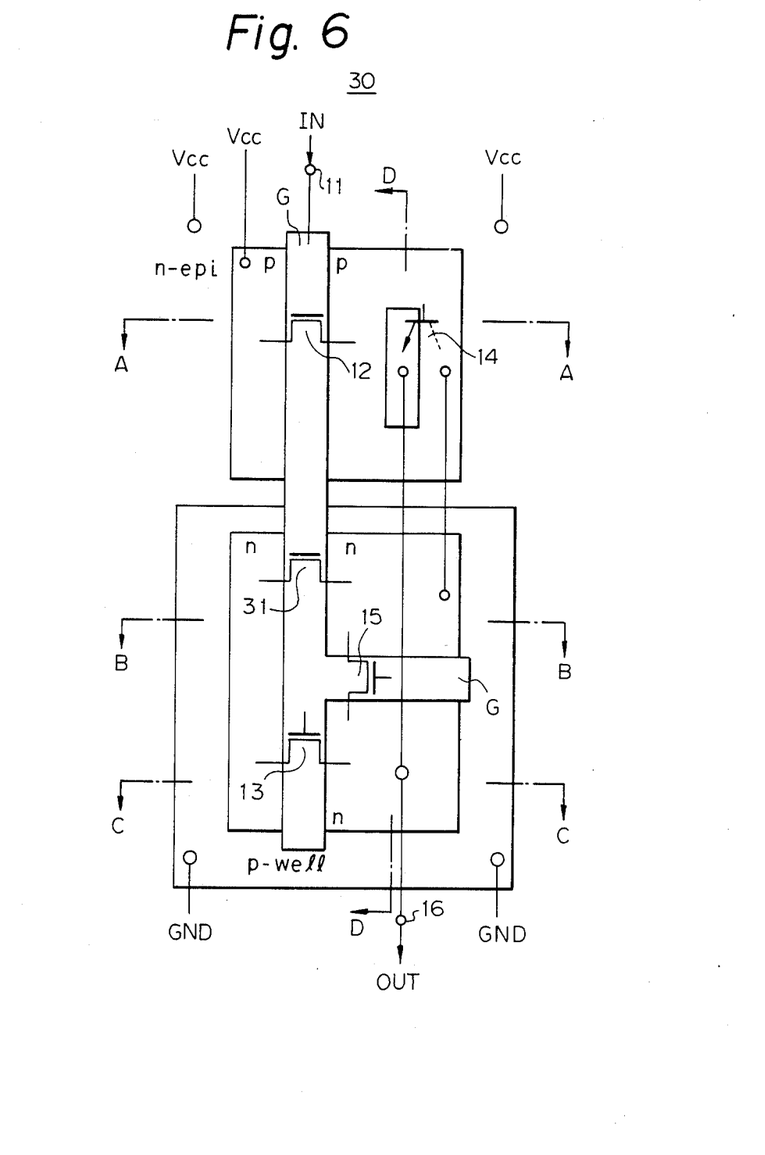
FIG. 6 is a plan view of a layout pattern, according to a first example, when fabricating the compound transistor type inverter shown in FIG. 4.
Figure 7A:
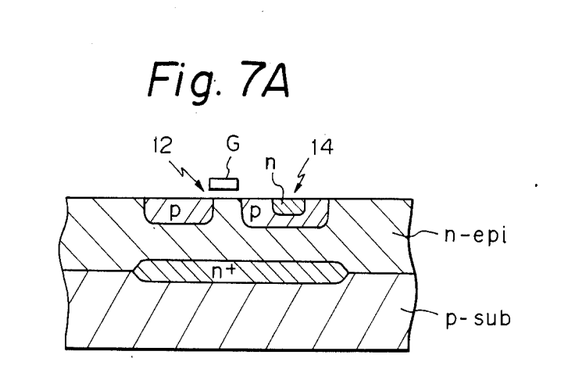
FIGS. 7A through 7D are cross sectional views taken along the lines A—A through D—D in FIG. 6, respectively.
Figure 7B:
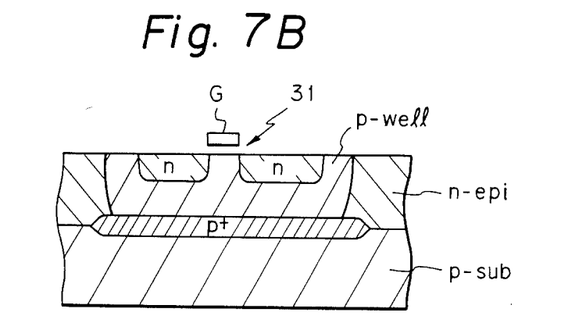
Figure 7C:
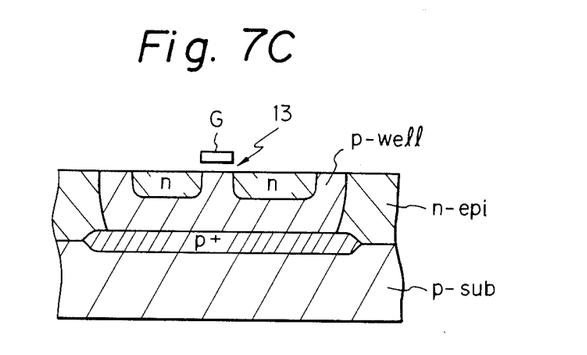
Figure 7D:
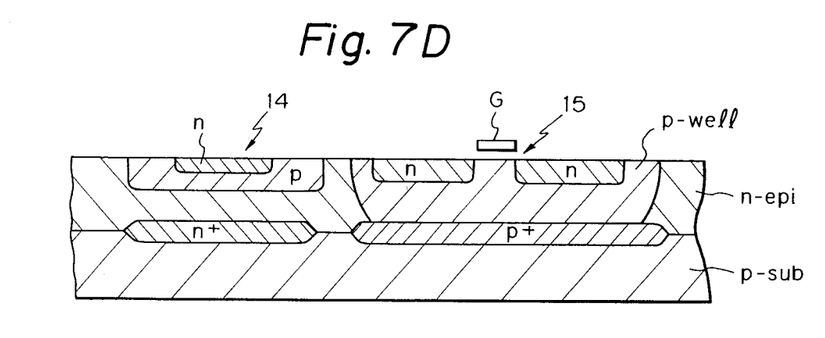

FIG. 6 is a plan view of a layout pattern, according to a first example, in fabricating the compound transistor type inverter shown in FIG. 4. FIGS. 7A through 7D are cross sectional views taken along the lines A—A through D—D in FIG. 6, respectively. It should be understood that the symbols indicating the respective transistors shown in FIG. 6 are labelled only for easy comprehension of the relationship between Figs. 4 and 6. Further, each character G in FIGS. 6 and 7A through 7D represents a gate, but for simplicity the gate insulation layers are not illustrated in FIGS. 7A through 7D. Regarding the above-mentioned symbol, the collector of the transistor is shown by broken line in FIG. 6, since the collector is not formed at the surface of the related semiconductor substrate. Further, each symbol of a small circle represents a contact hole.

The inverter 30 is further added, compared with the inverter 10, with the n-channel MIS transistor 31, but the thus-added transistor 31 is set up unitarily with already existing transistors 13 and 15 by employing a T shaped (or Y shaped) gate and by commonly using the diffusion regions for forming the adjacent transistors 13 and 15. Accordingly, the addition of the n-channel MIS transistor 31 does not substantially increase the size of the inverter 30. In FIGS. 7A through 7D, characters "n-epi" represent an n-type epitaxial layer; "p-sub" a p-type substrate; and "n+" and "p+" represent buried layers for preventing a latchup phenomena.

Figure 8:
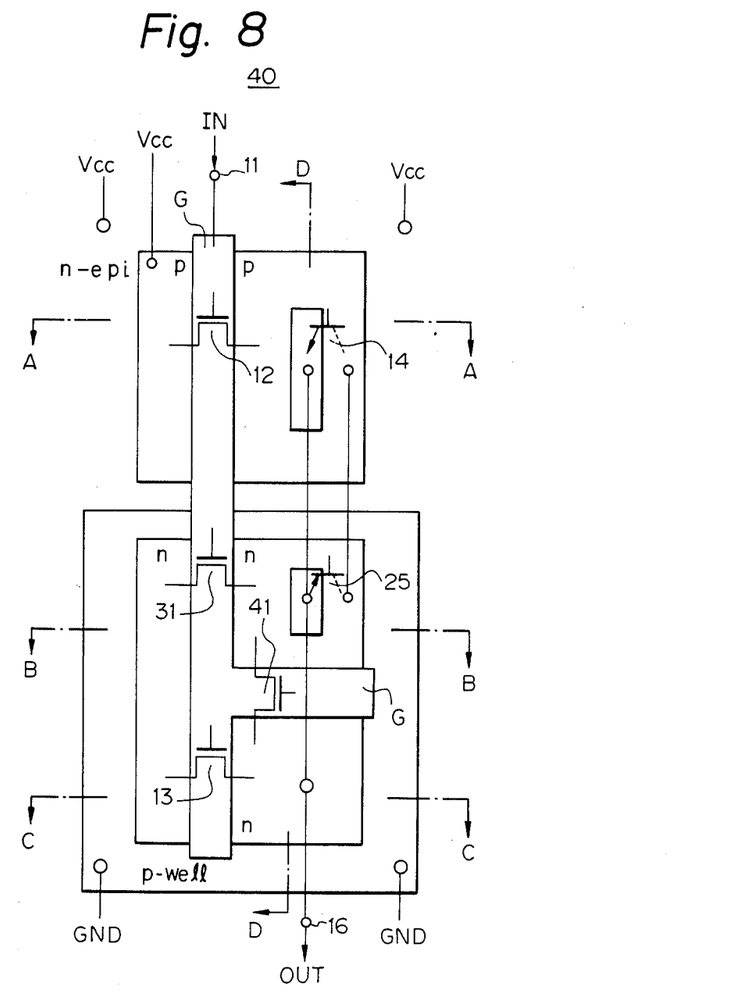
FIG. 8 is a plan view of a layout pattern, according to a second example, when fabricating the compound transistor type inverter shown in FIG. 5.
Figure 9A:
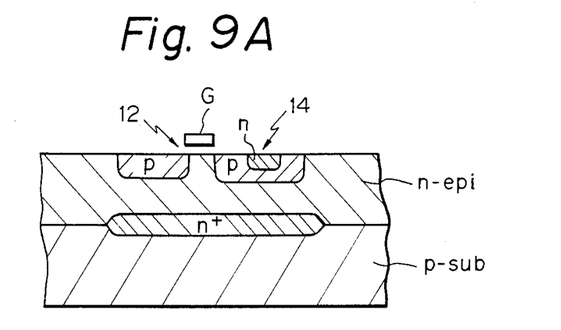
FIGS. 9A through 9D are cross sectional views taken along the lines A—A through D—D in FIG. 8, respectively.
Figure 9B:
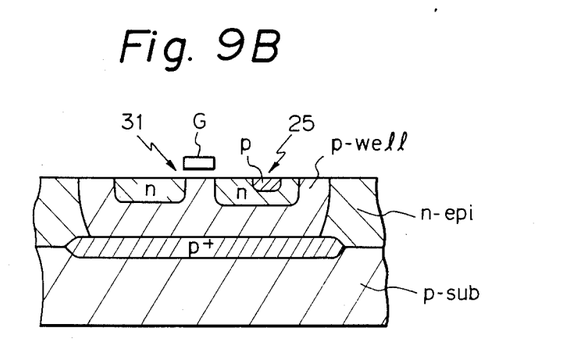
Figure 9C:
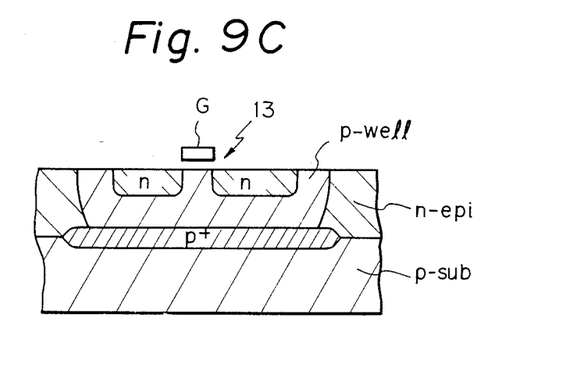
Figure 9D:
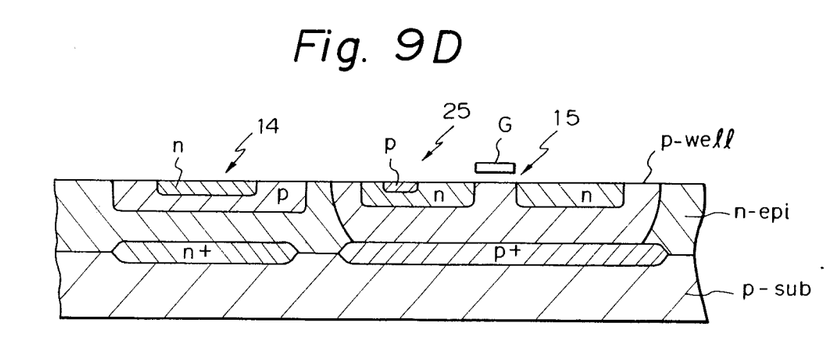

FIG. 8 is a plan view of a layout pattern, according to a second example of fabricating the compound transistor type inverter shown in FIG. 5. FIGS. 9A through 9D are cross sectional views taken along the lines A—A through D—D in FIG. 8, respectively. The arrangements of FIGS. 8 and 9A through 9D are similar to those of FIGS. 6 and 7A through 7D, except that, in the inverter 40, the transistor 15 is replaced by the transistor 41 and the transistor 25 is further mounted on the substrate. However, since the transistor 25 is unitarily formed with the adjacent transistors 13, 31 and 41, the total size thereof is not increased by the addition of the transistor 25.

Figure 10:
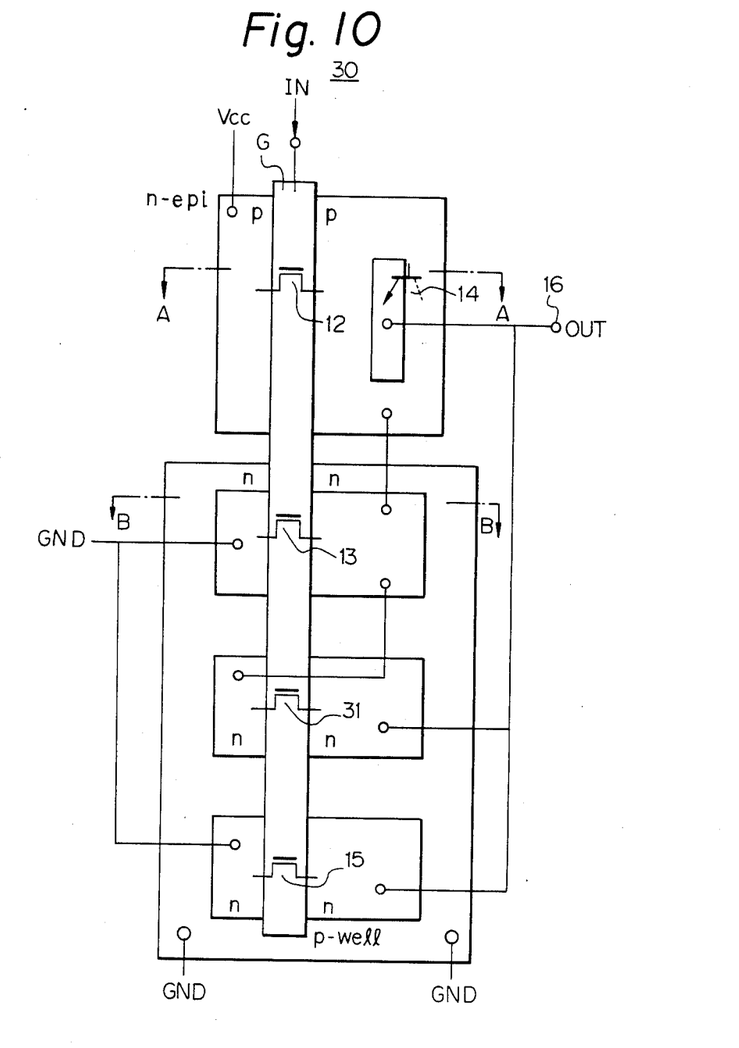
FIG. 10 is a plan view of a layout pattern, according to a third example, when fabricating the compound transistor type inverter shown in FIG. 4.
Figure 11A:
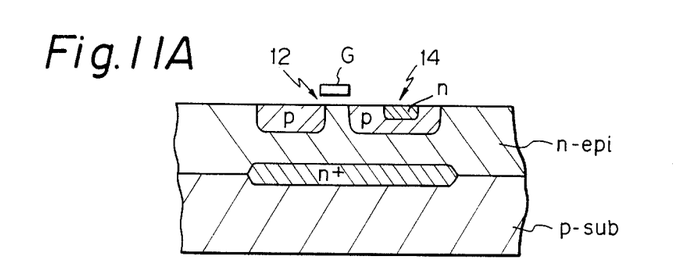
FIGS. 11A and 11B are cross sectional views taken along the lines A—A and B—B in FIG. 10, respectively.
Figure 11B:
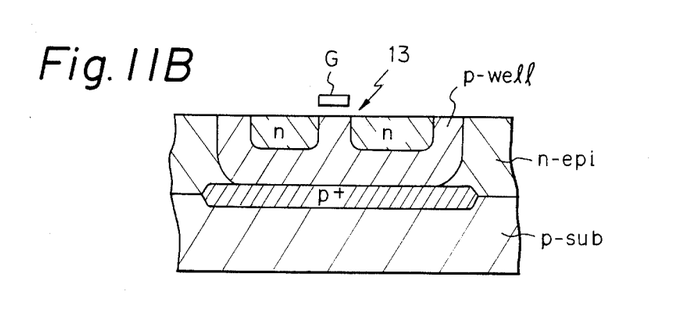

FIG. 10 is a plan view of a layout pattern, according to a third example, when fabricating the compound transistor type inverter shown in FIG. 4. FIGS. 11A and 11B are cross sectional views taken along the lines A—A and B—B in FIG. 10, respectively. The meanings of the characters are the same as those explained with reference to related previous figures. In the third example, three n-channel MIS transistors 13, 31, and 15 are aligned along a straight line, in this order.

As mentioned above in detail, during the change in the output level of the inverter from "H" to "L", the npn transistor 14 is quickly cut OFF. At the same time, the capability for drawing a current from the output terminal 16 is increased. The above mentioned quick cut OFF and the increased capability can be performed by a single n-channel MIS transistor 31 newly incorporated in the inverter. Further, regarding the inverter 40, another n-channel MIS transistor 41 is newly employed, other than the former n-channel MIS transistor 31. Therefore, the output level falls from "H" to "L" very quickly, and the thus obtained "L" level is also really low, as is the ground level. Thus, a high speed and stable inverter can be realized.

We claim:

1. A compound transistor type inverter comprising:
   an input stage MIS transistor pair comprising p-channel MIS transistor and an n-channel MIS transistor both being connected in series betwen a power source and a ground and connected commonly, at their gates, with an input terminal;
   an output stage transistor pair comprising an npn transistor and an n-channel MIS transistor being provided with a common output terminal connected to a series connection node between the npn transistor and the n-channel MIS transistor, said transistors being connected in series between the power source and the ground, the n-channel MIS transistor being connected, at the gate thereof, to the input terminal of the npn transistor being controlled, via the base thereof, by an output from the input stage MIS transistor pair; and
   an additional transistor means connected in the inverter, which additional transistor means is operative to shunt current between the base and the emitter of the npn transistor so as to attain a quick cut off of the npn transistor and, at the same time, attain a quick discharge of current to be drawn from the output terminal to the ground via the n-channel MIS transistor at the input stage.

2. An inverter as set forth in claim 1, wherein said additional transistor means comprises an n-channel MIS transistor having a gate connected to said input terminal.

3. A compound transistor type inverter comprising:
   an input stage MIS transistor pair comprising a p-channel MIS transistor and n-channel MIS transistor both being connected in series between a power source and a ground and connected commonly, at their gates, with an input terminal;
   an output stage transistor pair comprising an npn transistor and a pnp transistor being provided with a common output terminal connected to a series connection between the npn and the pnp transistors, said output transistors being connected in series between the power source and the ground, the npn and pnp transistors being commonly controlled, via their bases, by an output from the input stage MIS transistor pair; and
   an additional transistor means connected in the inverter, which additional transistor means is connected to said input terminal and controlled thereby to turn on when said npn transistor turns on and to turn off when said npn transistor turns off, and is operative when turned on to shunt current between the base and the emitter of the npn transistor so as to attain a quick cut-OFF of the npn transistor and, at the same time, attain a quick discharge of current to be drawn from the output terminal to the ground via the n-channel MIS transistor at the input stage.

4. A compound transistor type inverter comprising:
an input stage MIS transistor pair comprising a p-channel MIS transistor and n-channel MIS transistor both being connected in series between a power source and a ground and connected commonly, at their gates, with an input terminal;
an output stage transistor pair comprising an npn transistor and a pnp transistor being provided with a common output terminal connected to a series connection between the npn and the pnp transistors, said output transistors being connected in series between the power source and the ground, the npn and pnp transistors being commonly controlled, via their bases, by an output from the input stage MIS transistor pair;
an additional transistor means connected in the inverter, which additional transistor means is operative to shunt current between the base and the emitter of the npn transistor so as to attain a quick cut-OFF of the npn transistor and, at the same time, attain a quick discharge of current to be drawn from the output terminal to the ground via the n-channel MIS transistor at the input stage; and
another additional transistor means connected in the inverter so as to be operative to bypass the emitter and collector of said pnp transistor.

5. An inverter as set forth in claim 4, wherein said another additional traniistor means comprises an n-channel MIS transistor having a gate connected to said input terminal.

6. A compound transistor type inverter comprising:
an input stage MIS transistor pair comprising a p-channel MIS transistor and n-channel MIS transistor both being connected in series between a power source and a ground and connected commonly, at their gates, with an input terminal;
an output stage transistor pair comprising an npn transistor and a pnp transistor being provided with a common output terminal connected to a series connection between the npn and the pnp transistors, said output transistors being connected in series between the power source and the ground, the npn and pnp transistors being commonly controlled, via their bases, by an output from the input stage MIS transistor pair; An additional transistor means connected in the inverter, which additional transistor means is operative between the base and the emitter of the npn transistor so as to attain a quick cut-OFF of the npn transistor and, at the same time, attain a quick discharge of current to be drawn from the output terminal to the ground via the n-channel MIS transistor at the input stage, and said additional transistor means comprises an n-channel MIS transistor having a gate connected to said input terminal.

7. A bipolar-MISFET inverter comprising:
an input terminal (11);
an output terminal (16);
a first power source (Vcc);
a second power source (GND) supplying a voltage lower than that of the first power source;
a p-channel MIS transistor (12), the source and the gate thereof being connected, respectively, to the first power source and the input terminal;
a first n-channel MIS transistor (13), the source, the gate and the drain thereof being connected, respectively, to the second power source, the input and the drain of said p-channel MIS transistor (12);
an npn transistor (14), the collector, the base and the emitter thereof being connected, respectively, to the first power source, the drain of said p-channel MIS transistor (12) and the output terminal;
a second n-channel MIS transistor (15), the drain, the gate and the source thereof being connected, respectively, to the output terminal, the input terminal and the second power source; and
a third n-channel MIS transistor (31) coupled between the output terminal and the drain of the first n-channel MIS transistor (13), the gate thereof being connected to the input terminal.

8. A bipolar-MISFET inverter comprising:
an input terminal (11);
an output terminal (16);
a first power source (Vcc);
a second power source (GND) supplying a voltage lower than that of the first power source;
a p-channel MIS transistor (12), the source and the gate thereof being connected, respectively, to the first power source and the input terminal;
a first n-channel MIS transistor (13), the source, the gate and the drain thereof being connected, respectively, to the second power source, the input and the drain of said p-channel MIS transistor (12);
an npn transistor (14), the collector, the base and the emitter thereof being connected, respectively, to the first power source, the drain of said p-channel MIS transistor (12) and the output terminal;
a pnp transistor (25), the collector, the base and the emitter thereof being connected, respectively, to the second power source, the drain of said p-channel MIS transistor (12) and the output terminal; and
a second n-channel MIS transistor (31) coupled between the output terminal and the drain of the first n-channel IS transistor (13), the gate thereof being connected to the input terminal.

9. A bipolar-MISFET inverter as recited in claim 8, further comprising a third n-channel MIS transistor (41), the drain, the gate and the source thereof being connected, respectively, to the output terminal, the input terminal and the second power source.

* * * * *